US 8,018,982 B2

(12) United States Patent
Long

(10) Patent No.: US 8,018,982 B2
(45) Date of Patent: Sep. 13, 2011

(54) SLICED FIBER BRAGG GRATING USED AS EXTERNAL CAVITY FOR SEMICONDUCTOR LASER AND SOLID STATE LASER

(75) Inventor: Pin Long, LaSalle (CA)

(73) Assignee: Pin Long, LaSalle, QC (CA)

( * ) Notice: Subject to any disclaimer, the term of this patent is extended or adjusted under 35 U.S.C. 154(b) by 167 days.

(21) Appl. No.: 12/104,573

(22) Filed: Apr. 17, 2008

(65) Prior Publication Data
US 2009/0262774 A1 Oct. 22, 2009

(51) Int. Cl.
H01S 5/068 (2006.01)
H01S 5/14 (2006.01)

(52) U.S. Cl. ...... 372/102; 372/32; 372/50.11; 372/43.01

(58) Field of Classification Search ............... 372/43.01, 372/102, 32, 50.11
See application file for complete search history.

(56) References Cited

U.S. PATENT DOCUMENTS

| | | | |
|---|---|---|---|
| 5,422,897 A * | 6/1995 | Wyatt et al. | 372/6 |
| 5,838,700 A * | 11/1998 | Dianov et al. | 372/6 |
| 7,218,659 B2 * | 5/2007 | Schmidt et al. | 372/45.01 |
| 2002/0081066 A1 * | 6/2002 | Brun et al. | 385/34 |
| 2005/0058167 A1 * | 3/2005 | Kuramachi et al. | 372/43 |
| 2005/0095511 A1 * | 5/2005 | Cho et al. | 430/5 |
| 2007/0127538 A1 * | 6/2007 | Lee et al. | 372/92 |

* cited by examiner

Primary Examiner — Jessica Stultz
Assistant Examiner — Michael Carter

(57) ABSTRACT

A Fiber Bragg grating is sliced into small segments (such as 1 mm in length), the sliced fiber Bragg grating segments are used as external cavities for lasers to stabilize their center wavelength. In one embodiment, a semiconductor laser has an anti-reflection coating on the front facet and a high reflectivity coating on the back facet, a sliced fiber Bragg grating is used as a partial reflection mirror to form a lasing cavity. Since the sliced fiber Bragg grating has a very small wavelength drift with temperature change, the semiconductor laser has a stable center wavelength output. In the other embodiment, a solid state laser has an anti-reflection coating on the front facet and a high reflectivity coating on the back facet, a sliced fiber Bragg grating is used as a partial reflection mirror to form a lasing cavity. The solid state laser has a stable center wavelength output.

12 Claims, 5 Drawing Sheets

SLICED FIBER BRAGG GRATING USED AS EXTERNAL CAVITY FOR SEMICONDUCTOR LASER AND SOLID STATE LASER

This present invention relates to stabilizing the center wavelength of a semiconductor or solid-state laser using a sliced fiber Bragg grating as an external cavity. The sliced fiber Bragg grating is a small segment of fiber Bragg grating which is cut. The light coming out of the slice fiber Bragg grating is still in free space and has small loss in energy compared with fiber Bragg grating in an optical fiber.

BACKGROUND OF THE INVENTION

Narrow bandwidth laser sources are very important for optical fiber telecommunication applications. The core technology of DWDM is to increase the capacity of single mode fiber by using multiple wavelengths to carry the information. The center wavelength stability of laser sources is very critical for DWDM optical systems. Narrow bandwidth laser sources are very important devices for instrumentation, sensor, biomedical, metrology and telecommunication applications. Solid-state lasers have advantages in compactness and efficiency over other types. To achieve a single transverse mode laser, you can use different techniques to suppress the high order transverse modes.

Fiber Bragg gratings were first used by Brian F. Ventrudo (U.S. Pat. No. 5,715,263) to stabilize the intensity and frequency fluctuations of laser diodes. In Brian F. Vetrudo invention, an optical lens is used to couple the laser diode with optical fiber which contains the fiber Bragg grating. Jean-Marc Verdiell et al. have used fiber Bragg gratings with high reflectivity back facet laser diodes to form an external cavity for suppression of longitudinal mode hops and compensation of wavelength shift (U.S. Pat. No. 5,870,417). A recent invention by Dmitri V. Kuksenkov et al. uses fiber gratings to define the end of the optical cavity for discriminating against the lasing of higher-order transverse modes in the multi-mode gain region (U.S. Pat. No. 6,625,182). There are some disadvantages for these inventions which use fiber Bragg gratings as external cavities to suppress longitude and lateral mode hops:
1. The light from laser diodes, solid state lasers or gain mediums must be coupled into the optical fiber with high energy loss;
2. The fiber Bragg gratings are usually not located at the fiber end, but some distance from the fiber end increasing the length of the optical cavity, which makes it difficult to modulate the laser diode at a high frequency.
3. There are many applications that need free space laser diodes and do not need light to be coupled into optical fibers, which limits the use of Fiber Bragg gratings as external cavities.

Others have used volume holographic gratings as external cavities to reduce laser bandwidth and to stabilize laser operation wavelength (U.S. Pat. No. 5,691,989). Volume holographic gratings are of small size (around 1 mm cubic) and they can be packaged inside a TO-Can of a laser diode. A laser diode with a volume holographic grating external cavity still has a free space beam. Several companies now manufacture laser diodes with volume holographic external cavities. There are also some drawbacks for volume holographic gratings as laser diodes external cavities:
1. High manufacturing cost and complex manufacturing process of the volume holographic gratings are the main obstacles to the widely use of volume holographic gratings;
2. Volume holographic gratings can not stand high power applications;
3. Long and short period volume holographic gratings are difficult to be manufactured.

It can be seen that the present invention provides a simple solution of external cavity for free space laser diodes and solid state lasers which overcomes the problems met with the two approaches mentioned above.

OBJECTS OF THE INVENTION

An object of the present invention is to provide a sliced fiber Bragg grating to create an external cavity that will select one lasing wavelength and suppress all the other lasing wavelengths coming from a semiconductor or a solid-state laser.

Another object of the present invention is to provide a single wavelength operating laser generated by a sliced fiber Bragg grating external cavity at low cost.

Still another object of the present invention is to provide a single wavelength operating laser generated by a sliced fiber Bragg grating external cavity which does not have to be coupled to an optical fiber.

Still another object of the present invention is to provide a single wavelength operating laser generated by a sliced fiber Bragg grating external cavity which can used as a free space laser beam.

Still another object of the present invention is to provide a single wavelength operating laser generated by a sliced fiber Bragg grating external cavity with a high power laser beam output.

Other objects and advantages of the present invention will become apparent from a meticulous reading of the detailed description provided herein, with appropriate reference to the accompanying drawings.

SUMMARY OF THE INVENTION

According to the present invention, a single wavelength semiconductor or solid-state laser is obtained using an external cavity design. The external cavity is composed of a high reflectivity coating on the rear facet, an anti-reflection coating on the front facet, and a sliced fiber Bragg grating acting as a front facet mirror. A single mode optical fiber or multimode optical fiber has a fiber Bragg grating written on it. The fiber Bragg grating is sliced into small segments (around 1 mm in length). Each segment contains a Bragg grating written in the fiber core. The segment containing the Bragg grating is bound to the front facet of the semiconductor laser. The front facet is coated with an anti-reflection (AR) layer of low reflectivity, and the rear facet is coated with high reflectivity layer. The single wavelength operating laser is ensured by the external cavity which is the combination of the segment containing the Bragg grating and the high reflectivity rear facet of the semiconductor laser. Since the sliced fiber Bragg grating is very short, the wave front of the laser beam will remain almost the same after passing through it. The laser beam passing through the sliced fiber Bragg grating will remain a free space laser beam that does not need to be coupled into an optical fiber core with high coupling loss. The alignment of the laser emission facet (for example 1 um and 5 um in size for single mode semiconductor lasers) and the sliced fiber Bragg grating is very easy and simple If the fiber Bragg grating is written in a 50 um or a 100 um core multimode fiber.

Preferably, semiconductor lasers may be single mode or multimode.

Preferably, semiconductor lasers are from low power to high power range.

Preferably, solid-state lasers may be a diode pumped solid-state laser.

Preferably, solid-state lasers are from low power to high power range.

Preferably, the lasers have AR coating on the front facet and a high reflection coating on rear facet.

Preferably, semiconductor optical amplifiers (SOA) may be single mode or multimode.

Preferably, the sliced fiber Bragg gratings are written in single mode fiber or multimode fiber.

Preferably, the sliced fiber Bragg gratings are AR coated on both facets or are not AR coated on both facets.

BRIEF DESCRIPTION OF THE DRAWINGS

For a better understanding of the present invention, reference is made to the following detailed description and the attached figures, where.

DETAILED DESCRIPTION OF THE PREFERRED EMBODIMENTS

With reference to the annexed drawings the preferred embodiment of the present invention will be herein described for indicative purpose and by no means as of limitation.

Figure 1:
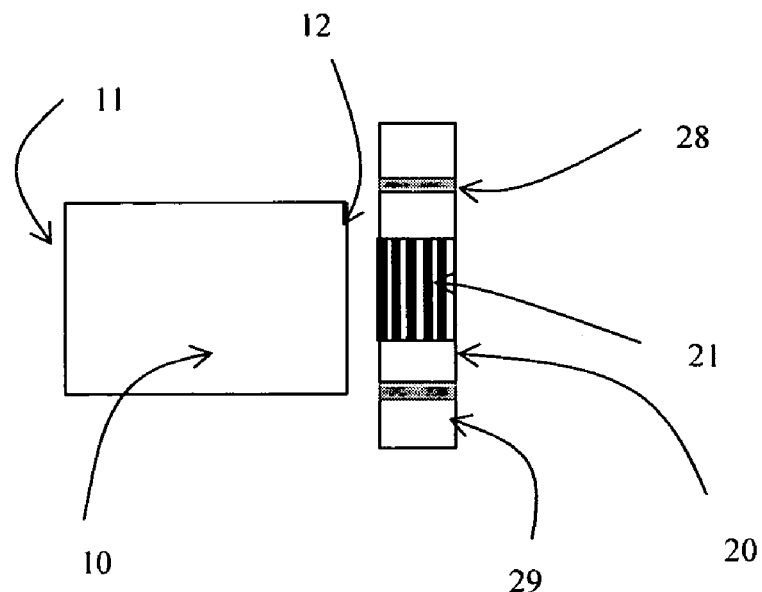
FIG. 1 is a view of an embodiment of setup using semiconductor laser with a front facet coated with an AR coating and rear facet coated with a high reflectivity coating, a sliced fiber Bragg grating to generate a single wavelength laser, showing the sliced fiber Bragg grating and the rear facet coated with a high reflection coating to build an external cavity laser for selecting a single wavelength.

Referring to FIG. 1, there is shown an embodiment of a semiconductor laser having a rear facet coated with a high reflection coating, a front facet with an AR coating, a sliced multimode fiber Bragg grating. The rear facet of the laser and the sliced fiber Bragg grating create an external cavity for the laser and the laser emits a single wavelength.

A semiconductor laser 10 has a rear facet 11 with a high reflection coating, a front facet 12 with an AR coating.

A slice of glass ferrule 29 containing a fiber Bragg grating 21 written on the fiber core 25 of a multimode mode optical fiber 20, which is placed on the front facet 12 of the semiconductor laser 10, used as a wavelength selector. Because the sliced fiber Bragg grating 21 is very thin (around one mm in thickness), the wave front and energy of the laser beam after passing through the sliced fiber Bragg grating 21, will remain a free space laser beam and almost unchanged. High light energy loss of laser beam will be the result if the laser beam is coupled into an optical fiber with a written fiber Bragg grating acting as a laser external cavity as used in other inventions like U.S. Pat. No. 654,321. In this invention, the laser beam is still in free space after passing through the slice of fiber Bragg grating 21 without any energy loss. Another advantage of this invention is that the alignment of the laser front facet 12 and the sliced fiber Bragg grating 21 is very easy and simple if the fiber Bragg grating 21 is written on a multimode fiber 20 of 50 um or 100 um core size. the sliced fiber Bragg grating 21 can withstand high power laser beam for high power lasers single wavelength selection. Another advantage of this invention is that the slice of fiber Bragg grating 21 is very close to the front facet 12 of laser diode 10 so that high modulation rate of laser diode 10 and better suppression of other laser modes can be achieved.

Figure 2:
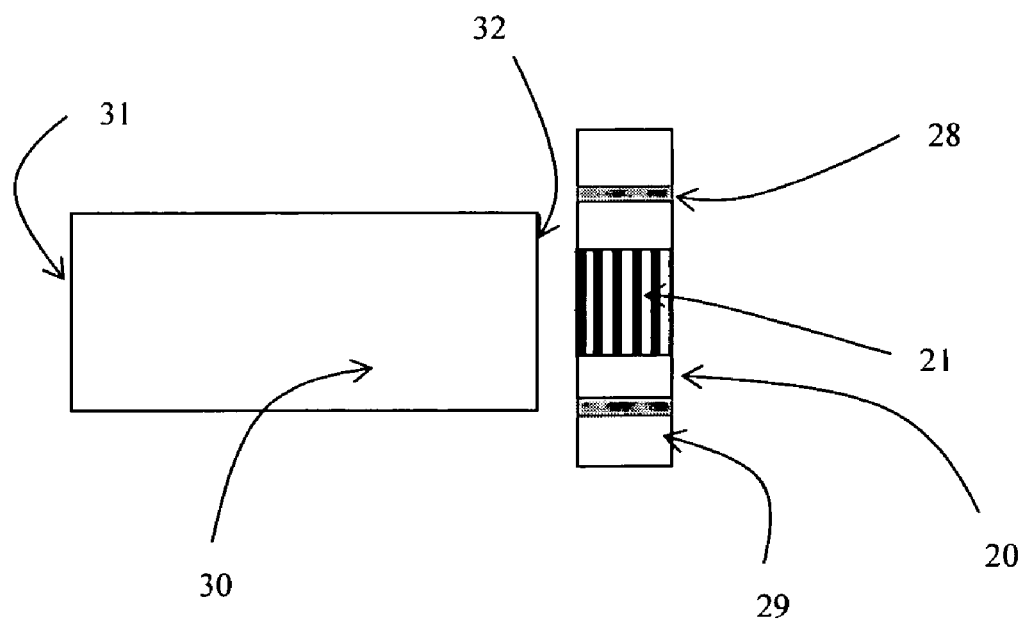
FIG. 2 is a view of an embodiment of setup using a solid state laser with a front facet coated with an AR coating and a rear facet coated with a high reflectivity coating, a sliced fiber Bragg grating to generate a single wavelength laser, showing the sliced fiber Bragg grating and the rear facet coated with a high reflection coating to build an external cavity laser for selecting a single wavelength.

Referring to FIG. 2, there is shown an embodiment of a solid state laser 30 having a rear facet 31 coated with a high reflection coating, a front facet 32 with an AR coating, a sliced fiber Bragg grating 21 written on a multimode fiber 20. The rear facet 31 of the solid state laser 30 and the sliced fiber Bragg grating 21 create an external cavity for the laser 30 and the laser 30 emits a single wavelength. A solid state laser 30 has a rear facet 31 with a high reflection coating, a front facet 32 with AR coating.

Figure 3:
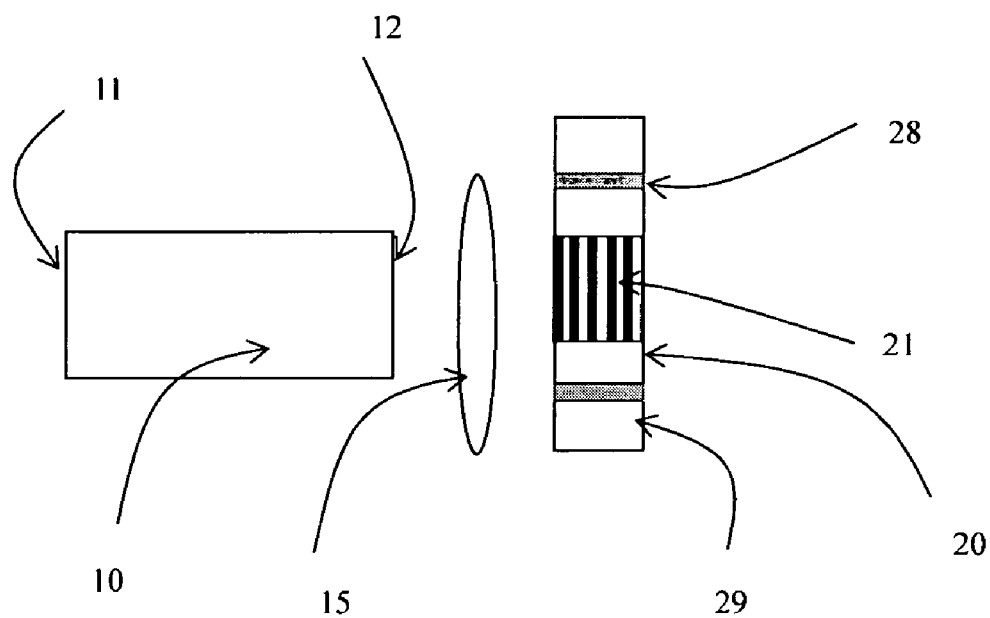
FIG. 3 is a view of an embodiment of setup using a semiconductor laser with a front facet coated with an AR coating and a rear facet coated with a high reflectivity coating, an optical lens is used to focus the laser beam into a sliced fiber Bragg grating to generate a single wavelength laser, showing the sliced fiber Bragg grating and the rear facet coated with a high reflection coating to build an external cavity laser for selecting a single wavelength.

Referring to FIG. 3, there is shown an embodiment of a semiconductor 10 having a rear facet 11 coated with a high reflection coating, a front facet 12 with an AR coating, an optical lens 15, a sliced fiber Bragg grating 21 written on a multimode fiber 20. The rear facet 11 of the semiconductor laser 10 and the sliced fiber Bragg grating 21 create an external cavity for the laser 10 and the laser 10 emits a single wavelength. The optical lens 15 is used to focus the light into the sliced fiber Bragg grating 21. The solid state laser 10 has a rear facet 11 with a high reflection coating, a front facet 12 with AR coating.

From FIG. 4 to FIG. 7 the processes of making a slice of fiber Bragg grating 21 have been demonstrated.

Figure 4:
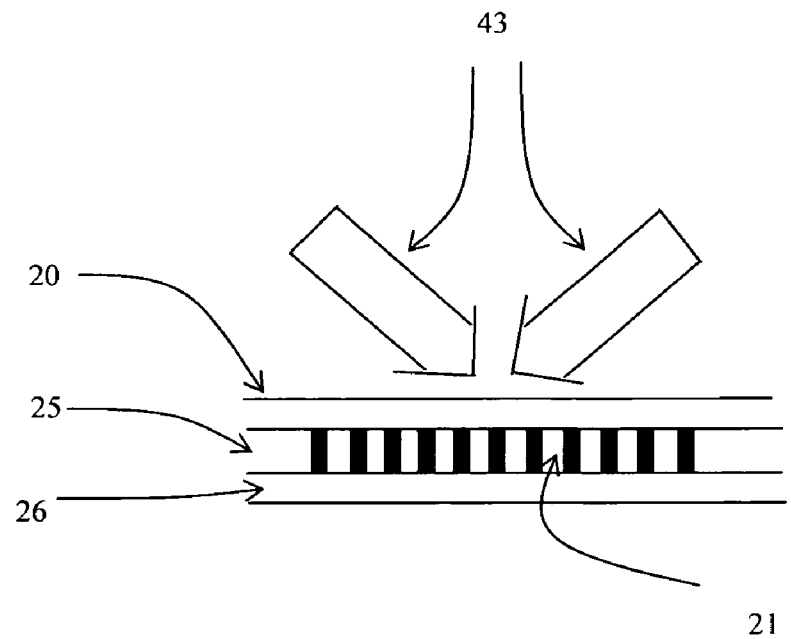
FIG. 4 is a view of an optical fiber (single mode or multimode) with a fiber Bragg grating written on it by an interference fringe pattern created by two UV laser beam crossing.

Referring to FIG. 4, there is shown that the fiber Bragg grating 21 is written by an interference fringe pattern of two crossing UV light beams 43 generated by one UV beam passing through a phase mask. Optical fiber 20 with fiber core 25 and fiber cladding 26 has fiber Bragg grating 21 written in fiber core 25.

Figure 5:
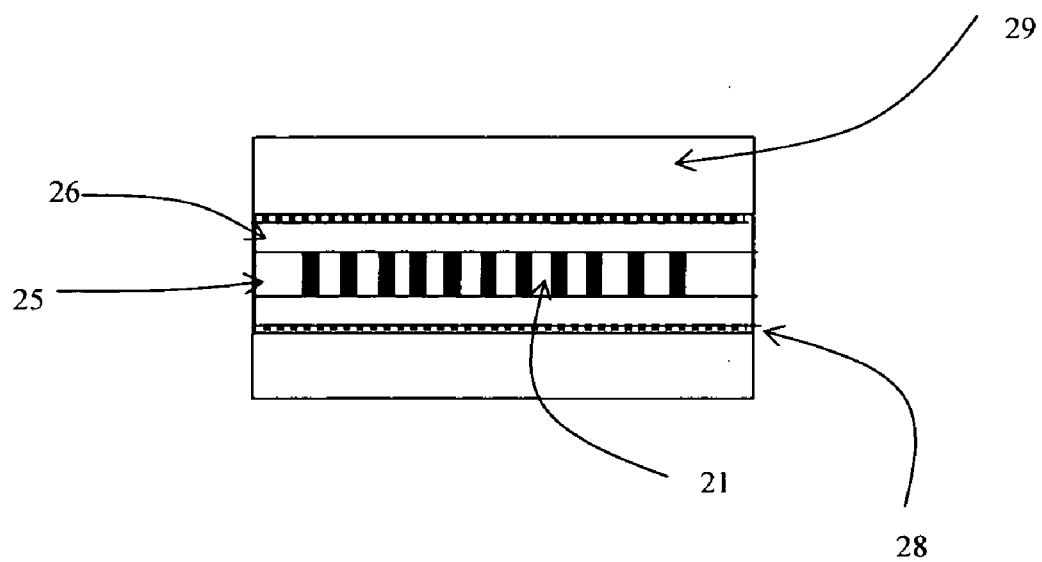
FIG. 5 is a view of the optical fiber with a fiber Bragg grating written on it, which is coated with epoxy and then is inserted into a glass ferrule or ceramic ferrule.

Referring to FIG. 5, there is shown that the fiber Bragg grating is applied some epoxy 28 and then is inserted into a glass ferrule 29 (or ceramic ferrule). Then the glass ferrule 29 with the fiber 20 having fiber Bragg grating 21 inside is placed into an oven for thermal curing the epoxy 28.

Figure 6:
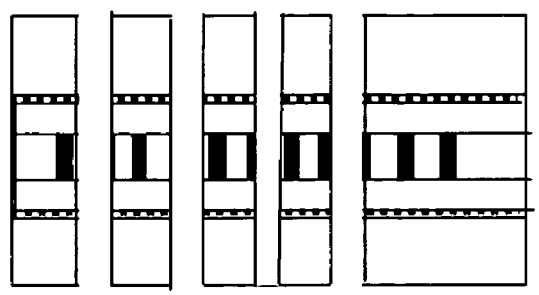
FIG. 6 is a view of the epoxy inside the glass or the ceramic ferrule containing a fiber Bragg grating being cured by heat or UV light.

Referring to FIG. 6, there is shown that after the epoxy 28 is cured, the glass ferrule 29 with the fiber Bragg grating is cut into small pieces (slices).

Figure 7:
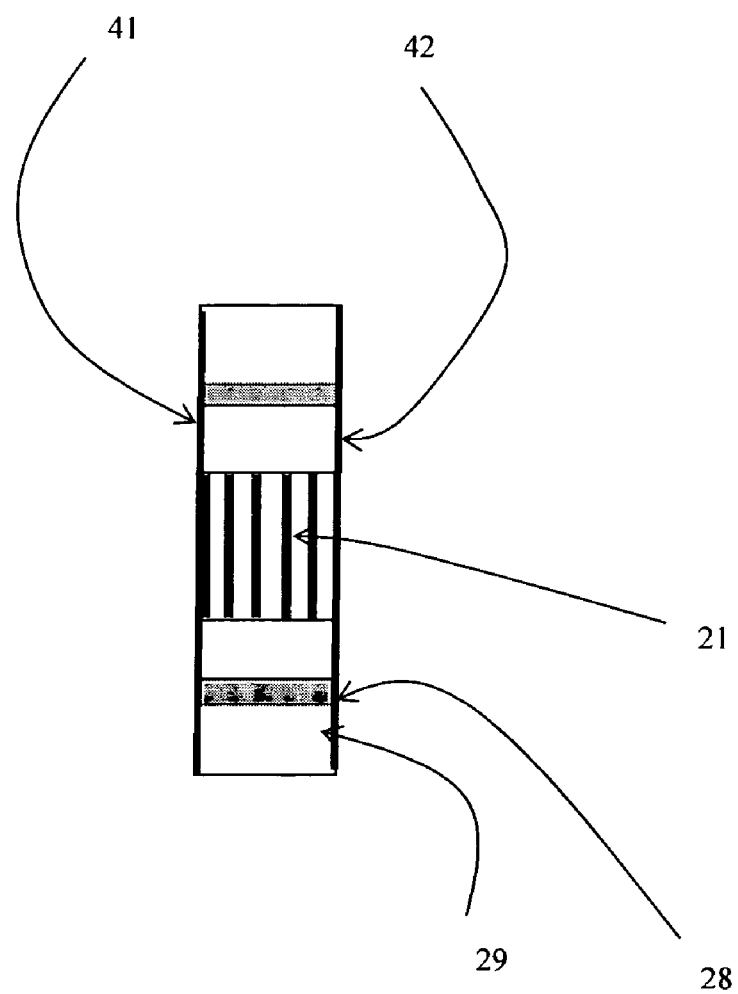
FIG. 7 is a view of the glass or ceramic ferrule containing the fiber Bragg grating cut into small slices (around one mm long).

Referring to FIG. 7, there is shown that the small piece of glass ferrule 29 with the fiber Bragg grating 21 is polished on both sides 41 and 42.

Figure 8:
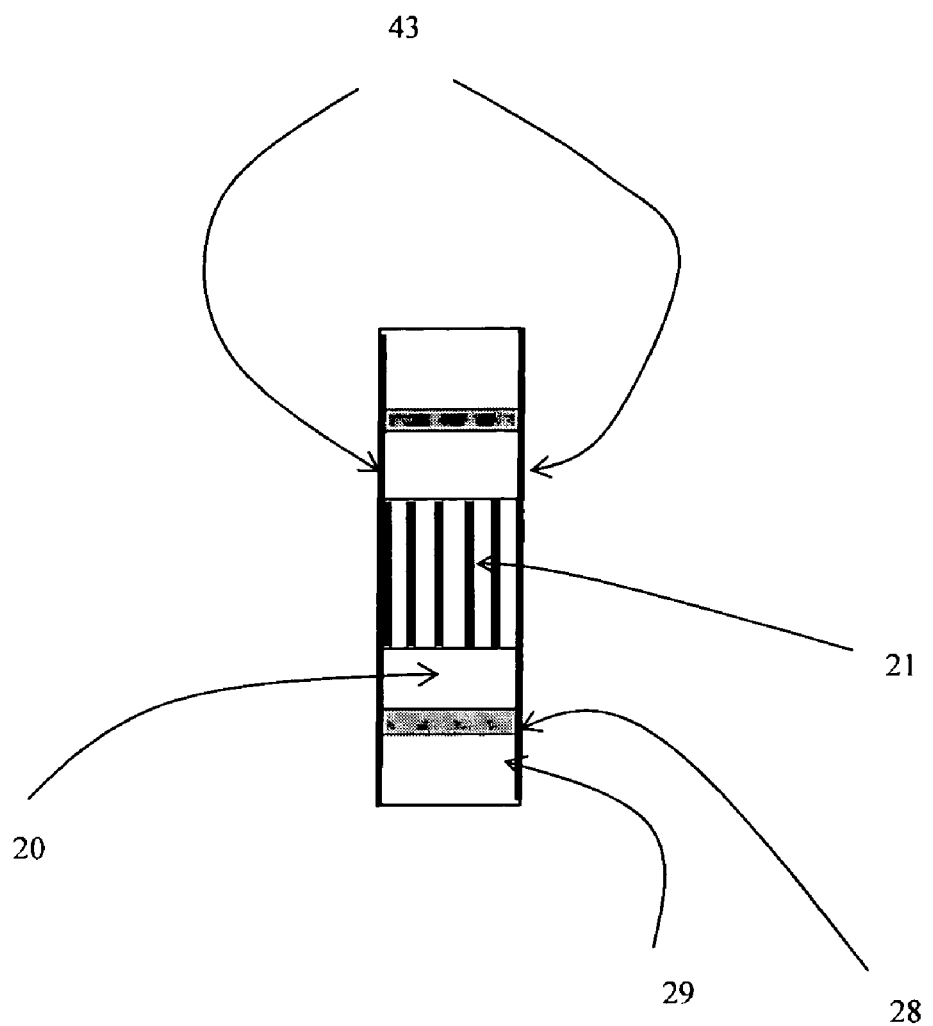
FIG. 8 is a view of the glass or ceramic ferrule pieces polished and then AR coated.

Referring to FIG. 8, there is shown that the small piece of glass ferrule 29 with the fiber Bragg grating 21, and the epoxy 28 filling between the glass ferrule 29 and the fiber 20. There is shown that the small piece of glass ferrule 29 with the fiber Bragg grating 21 is coated with an AR coating 43 on both sides.

I claim:

1. A single wavelength laser device comprises: a semiconductor laser having a rear facet with a high reflection coating and a front facet with an AR coating; a small fiber segment containing a fiber Bragg grating which extends the entire length of the fiber segment and wherein the length of the fiber segment is so short that it acts as a free space bulk device rather than a waveguide; and said fiber Bragg grating selecting a predetermined laser center wavelength and suppressing the other wavelengths.

2. A device as defined in claim 1, where said semiconductor laser is a single mode semiconductor laser.

3. A device as defined in claim 1, where said semiconductor laser is a multi mode semiconductor laser.

4. A device as defined in claim 1, there is an optical lens between said semiconductor laser and said small fiber segment, which is used for focusing said laser diode light into said small fiber segment.

5. A device as defined in claim 1, Where said small fiber segment with can be AR coating on both sides.

6. A method of making a fiber Bragg grating comprising: using a phase mask illuminated by a UV laser which generates two first order beams that cross and create an interference fringe pattern on either a single mode or multimode optical fiber; said optical fiber is coated with a layer of adhesive and inserted into a tube which has its inner hole filled with adhesive between the fiber Bragg grating and an inner wall of the tube; the tube and optical fiber are then heated to set the adhesive; the tube and optical fiber are cut into small pieces by using a dicing saw or another cutting tool, and coated with anti-reflection coatings after both ends are polished; the length of the tube and optical fiber is so short that it acts as a free space bulk device rather than a waveguide.

7. A method as defined in claim 6, wherein said tube can alternatively be ferrule commonly used in fiber optics connector.

8. A method as defined in claim 6, where said tube can be a metal tube.

9. A method as defined in claim 6, wherein said adhesive can be UV curable epoxy between said tube and said optical fiber containing fiber Bragg grating.

10. A method as defined in claim 6, wherein said adhesive can be soldering material between said tube and said optical fiber containing fiber Bragg grating.

11. A method as defined in claim 6, where said polished slices of the tube with a fiber Bragg grating inside its inner hole is coated with an AR coating on both sides.

12. A method as defined in claim 6, wherein said tube is a glass tube.

* * * * *